(12) United States Patent
Rachmady et al.

(10) Patent No.: US 7,364,976 B2
(45) Date of Patent: Apr. 29, 2008

(54) SELECTIVE ETCH FOR PATTERNING A SEMICONDUCTOR FILM DEPOSITED NON-SELECTIVELY

(75) Inventors: Willy Rachmady, Beaverton, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 11/387,012

(22) Filed: Mar. 21, 2006

(65) Prior Publication Data

US 2007/0224766 A1    Sep. 27, 2007

(51) Int. Cl.
*H01L 21/336* (2006.01)

(52) U.S. Cl. .............. 438/300; 438/197; 438/299; 438/341; 438/349; 438/350; 438/482; 438/488; 438/489; 257/E21.431

(58) Field of Classification Search ............ 438/341, 438/349, 350, 489
See application file for complete search history.

(56) References Cited

U.S. PATENT DOCUMENTS

| | | | |
|---|---|---|---|
| 6,235,568 B1 | 5/2001 | Murthy et al. | |
| 6,621,131 B2 | 9/2003 | Murthy et al. | |
| 6,703,291 B1 | 3/2004 | Boyanov et al. | |
| 6,861,318 B2 | 3/2005 | Murthy et al. | |
| 6,885,084 B2 | 4/2005 | Murthy et al. | |
| 2005/0179066 A1* | 8/2005 | Murthy et al. | ............... 257/288 |

OTHER PUBLICATIONS

Michael L. Hattendorf et al., Patent Application entitled "Strained NMSO Transistor Featuring Deep Carbon Doped Regions and Raised Donor Doped Source and Drain" filed Dec. 17, 2004, U.S. Appl. No. 11/014,937.
Anand Murthy et al., Patent Application entitled "CMOS Transistor Junction Regions Formed by a CVD Etching and Deposition Sequence", U.S. Appl. No. 11/029,740.

* cited by examiner

*Primary Examiner*—Michael S. Lebentritt
*Assistant Examiner*—Kyoung Lee
(74) *Attorney, Agent, or Firm*—Blakely, Sokoloff, Taylor & Zafman LLP

(57) ABSTRACT

A method to selectively etch, and hence pattern, a semiconductor film deposited non-selectively is described. In one embodiment, a carbon-doped silicon film is deposited non-selectively such that the film forms an epitaxial region where deposited on a crystalline surface and an amorphous region where deposited on an amorphous surface. A four-component wet etch mixture is tuned to selectively etch the amorphous region while retaining the epitaxial region, wherein the four-component wet etch mixture comprises an oxidizing agent, an etchant, a buffer and a diluent.

20 Claims, 9 Drawing Sheets

US 7,364,976 B2

1

SELECTIVE ETCH FOR PATTERNING A SEMICONDUCTOR FILM DEPOSITED NON-SELECTIVELY

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained silicon regions may greatly enhance the rate at which charge migrates in a channel when a semiconductor is in an ON state.

FIG. 1 depicts a typical strained PMOS-FET 100 fabricated on a substrate 102. A gate dielectric layer 104 sits above a channel region 106 and a gate electrode 108 sits above a gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. Strain-inducing source/drain regions are comprised of a material with a larger lattice constant than that of the channel region 106. In typical PMOS-FETs, the channel region 106 is comprised of crystalline silicon, while the strain-inducing source/drain regions 120 are comprised of epitaxial silicon/germanium which has a larger lattice constant than that of crystalline silicon. Strain-inducing source/drain regions 120 can invoke a uniaxial compressive strain on the channel region 106. Such a compressive strain in the channel region 106 can enhance the hole mobility in the channel region 106 of a PMOS-FET, lending to improved performance of the device.

FIGS. 2A-C illustrate a typical process flow for forming strain-inducing source/drain regions in a PMOS-FET. Referring to FIG. 2A, a non-strained PMOS-FET 200 is first formed. Non-strained PMOS-FET 200 is comprised of a channel region 206. A gate dielectric layer 204 sits above the channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206. Referring to FIG. 2B, portions of substrate 202 are removed, e.g. by an etch process, to form recessed regions 216 in substrate 202. Subsequently, strain-inducing source/drain regions 220 are formed by selectively growing an epitaxial film into recessed regions 216, as depicted in FIG. 2C. Strain-inducing source/drain regions 220 can be doped with charge carrier atoms, e.g. boron in the case of a PMOS-FET, which may be done in situ (during the deposition of the epitaxial film) or after epitaxial film growth (which may require a subsequent anneal process), or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing source/drain regions 220 are comprised of a material with a larger lattice constant than that of the channel region 206. Therefore, a uniaxial compressive strain, depicted by the arrows in FIG. 2C, is rendered on channel region 206 in PMOS-FET 230, which can enhance hole mobility in the device.

In order to improve performance in N-type Metal Oxide Semiconductor Field-Effect Transistors (NMOS-FETs), a uniaxial tensile strain may be required to enhance electron mobility in the channel region. This may require incorporation of strain-inducing source/drain regions with a smaller lattice constant than that of the channel region. For example, epitaxial carbon-doped silicon source/drain regions may be desirable for NMOS-FETs with a crystalline silicon channel region because the lattice constant of epitaxial carbon-doped silicon is smaller than that of crystalline silicon. However, selective deposition of an epitaxial carbon-doped silicon film can be difficult to control with very narrow processing windows. Thus, a method to pattern a non-selective N-type epitaxial carbon-doped silicon film is described herein.

DETAILED DESCRIPTION

Figure 1:
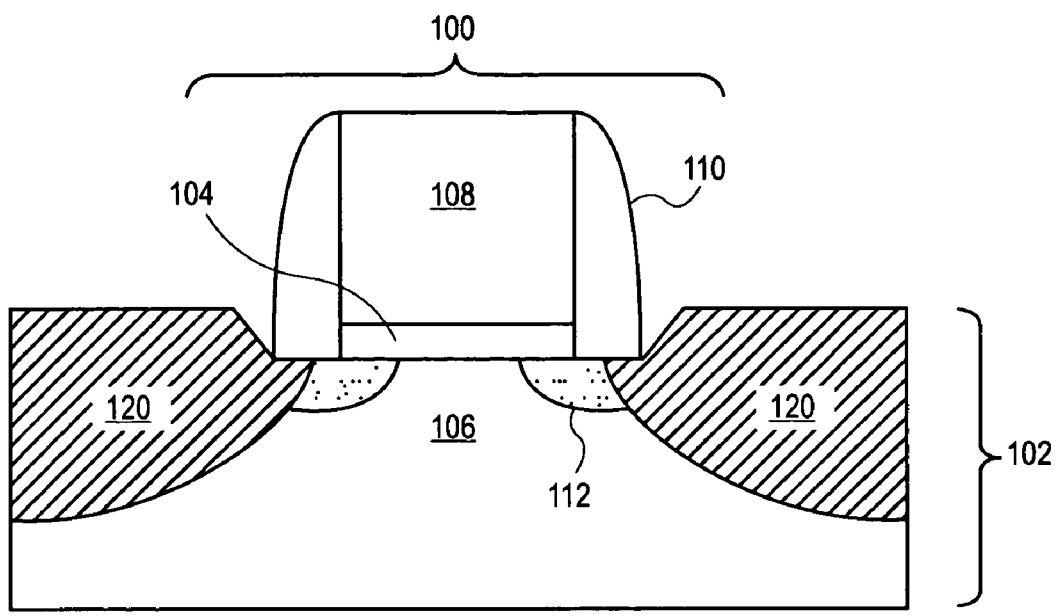
FIG. 1 illustrates a cross-sectional view of a strained P-type Metal Oxide Semiconductor Field-Effect Transistor (PMOS-FET), in accordance with the prior art.
Figure 2A:
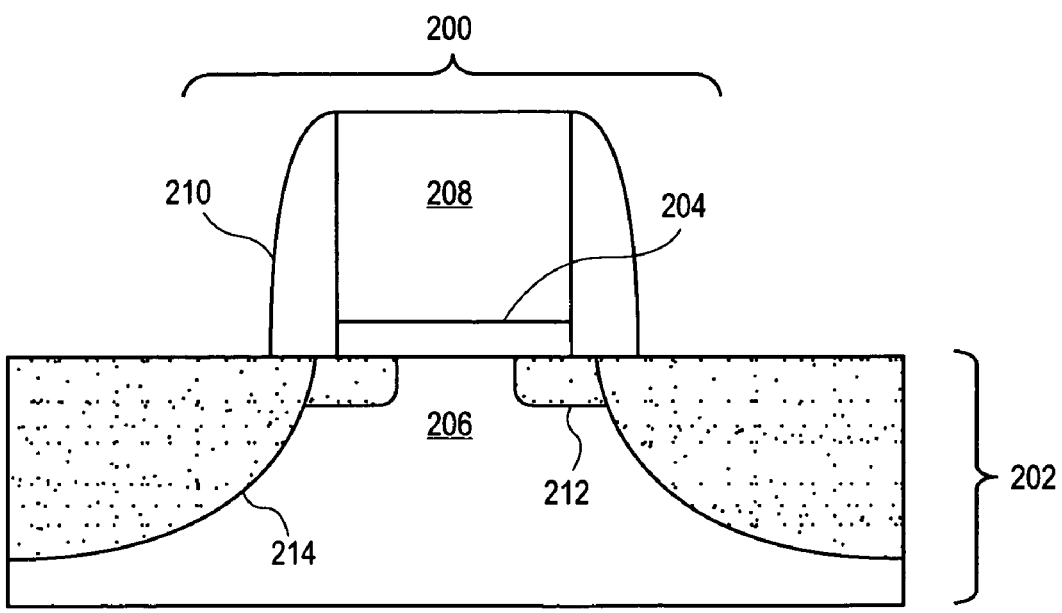
FIGS. 2A-C illustrate cross-sectional views representing the formation of a PMOS-FET with strain-inducing source/drain regions, in accordance with the prior art.
Figure 2B:
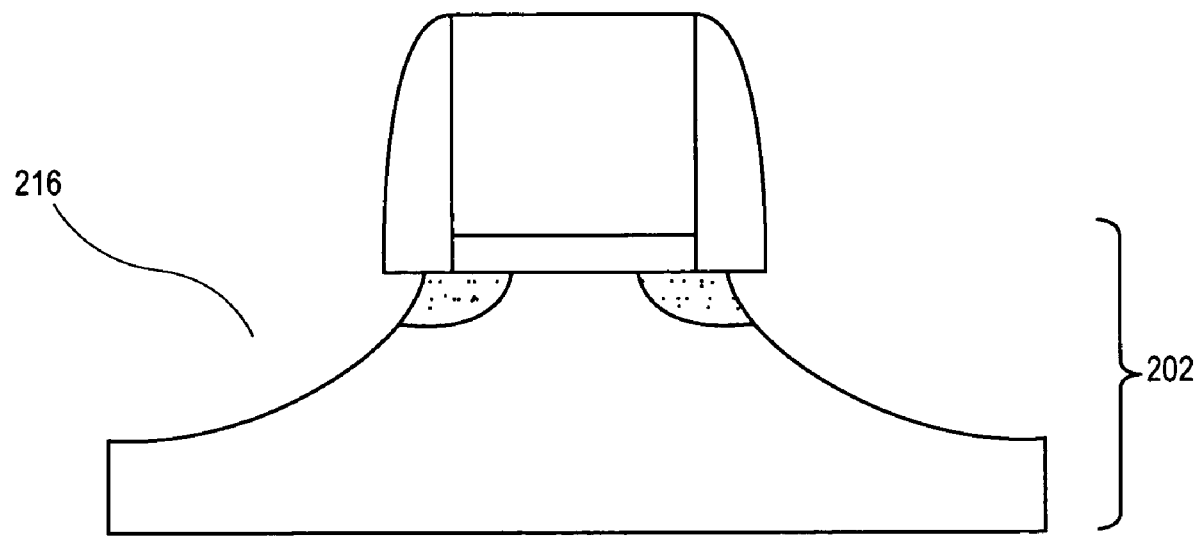
Figure 2C:
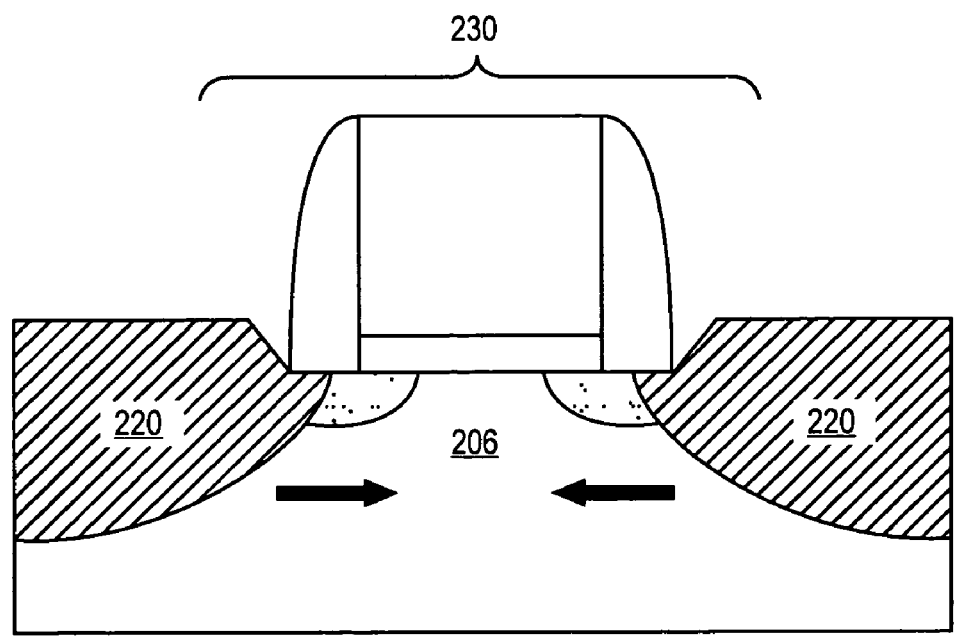

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps, are not described in detail in order to not unnecessarily obscure the present invention. Furthermore, it is understood that the various embodiments shown in the figures are illustrative representations and are not necessarily drawn to scale.

Disclosed herein is a method to selectively etch, and hence pattern, a semiconductor film deposited non-selectively. Selective etching to pattern a semiconductor film after its non-selective deposition may enable the use of a broader process window at the time of deposition because the constraints associated with selective deposition are removed. For example, in accordance with an embodiment of the present invention, a carbon-doped silicon film is deposited non-selectively such that the film forms an epitaxial region where deposited on a crystalline surface and an amorphous region where deposited on an amorphous surface. By not being confined to a selective deposition such that deposition occurs only on crystalline surfaces, a greater variety of carbon-doped silicon films may be utilized, e.g. a broader range of films with varying carbon composition may be accessible. However, it may be desirable to retain only the crystalline (epitaxial) regions of a non-selectively deposited semiconductor film.

A selective etch process may selectively remove the amorphous regions of a non-selectively deposited semiconductor film, while retaining the crystalline regions of the non-selectively deposited semiconductor film. Depending on the composition of the specific film being selectively etched, such a selective etch process may require tuning to accommodate the characteristics of a specific film. For an optimized etch process, a selectivity of greater than 10:1, and even greater than 20:1, may be achieved when etching an amorphous component of a film while retaining an epitaxial portion of a film.

A four-component wet etch mixture may be amenable to the necessary tunability required to accommodate the selective etching of a variety of film compositions, wherein the four-component wet etch mixture comprises an oxidizing agent, an etchant, a buffer and a diluent. An oxidizing agent may be employed to modify a portion of a film for selective etching by converting that portion to its corresponding oxide. For example, an oxidizing agent may oxidize a portion of a silicon film to silicon dioxide. In accordance with an embodiment of the present invention, the oxidixing agent is nitric acid, hydrogen peroxide or di-tert-butylperoxide. An etchant may be employed to dissolve the portion of the film that was oxidized by the oxidizing agent. For example, an etchant may dissolve only the portion of a silicon film that was oxidized by the oxidizing agent to form silicon dioxide. In accordance with an embodiment of the present invention, the etchant is hydrofluoric acid, ammonium fluoride, or tetramethyl ammonium fluoride. A buffer may be used to mitigate potential pH swings that may otherwise occur as component of the etched film become dissolved in the four-component wet etch mixture, enabling maintenance of a set pH within a factor of 0.1. In accordance with an embodiment of the present invention, the buffer is acetic acid, methanol, or ethanol. A diluent may be utilized to slow the activity, and hence etch rate, of a four-component wet etch mixture, enabling control over the timing of the etch process. In accordance with an embodiment of the present invention, the diluent is water and it is either added to the four-component wet etch mixture as a distinct ingredient or is already present as a component of the oxidizing agent, the etchant, or the buffer. In one embodiment, the four component wet etch mixture exhibits etch selectivity greater than 20:1 between amorphous and crystalline portions of a film, meaning that the amorphous portion is removed at least 20-fold faster than the crystalline portion.

For example, in accordance with one embodiment of the present invention, the semiconductor film to be selectively etched (i.e. amorphous regions removed and epitaxial regions retained) comprises a carbon-doped silicon film and the four-component wet etch mixture comprises an oxidizing agent (nitric acid), an etchant (hydrofluoric acid), a buffer (acetic acid), and a diluent (water). As the % carbon composition varies in non-selectively deposited carbon-doped silicon film, the local pH (the pH of the first several mono-layers of the wet etch mixture adjacent the carbon-doped silicon film) may vary, potentially compromising the selectivity of the wet etch mixture. Thus, in order to accommodate the characteristics of a specific non-selectively deposited film during a selective etch process, the component ratios of the four-component wet etch mixture may require modification to maintain etch selectivity between the amorphous regions and the epitaxial regions of the film.

Figure 3A:
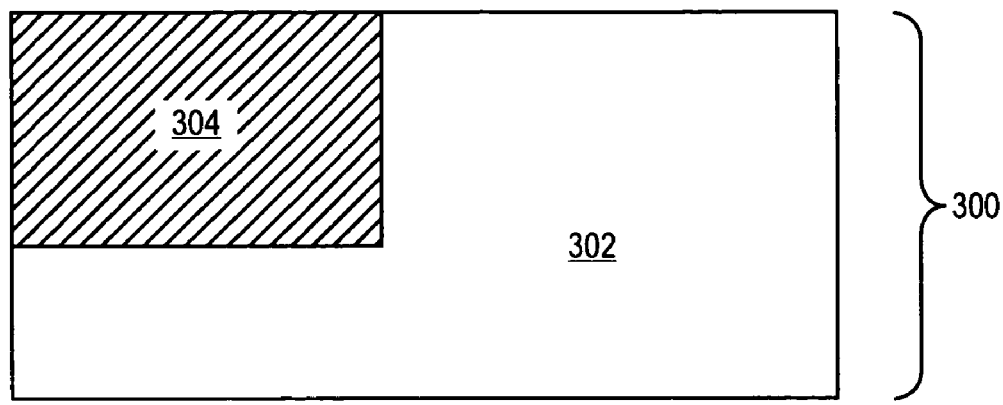
FIGS. 3A-D illustrate cross-sectional views representing the non-selective deposition and subsequent selective etching of a semiconductor film, in accordance with an embodiment of the present invention.

As an example of one embodiment of the present invention, FIGS. 3A-D illustrate the non-selective deposition and subsequent selective etching of a semiconductor film. Referring to FIG. 3A, a suitable substrate 300 may comprise a single crystalline portion 302 and an amorphous portion 304. In one embodiment of the present invention, crystalline portion 302 is comprised of crystalline silicon or an epitaxial silicon region grown atop a distinct crystalline silicon substrate. In another embodiment, crystalline portion 302 is comprised of germanium or a III-V material such as but not limited to gallium nitride, gallium phosphide, gallium arsenide, indium phosphide or indium antimonide. In one embodiment, amorphous portion 304 is comprised of an oxide or a nitride material. In another embodiment, amorphous portion 304 is comprised of silicon nitride, silicon dioxide, silicon oxy-nitride or a high-k material such as hafnium oxide.

Figure 3B:
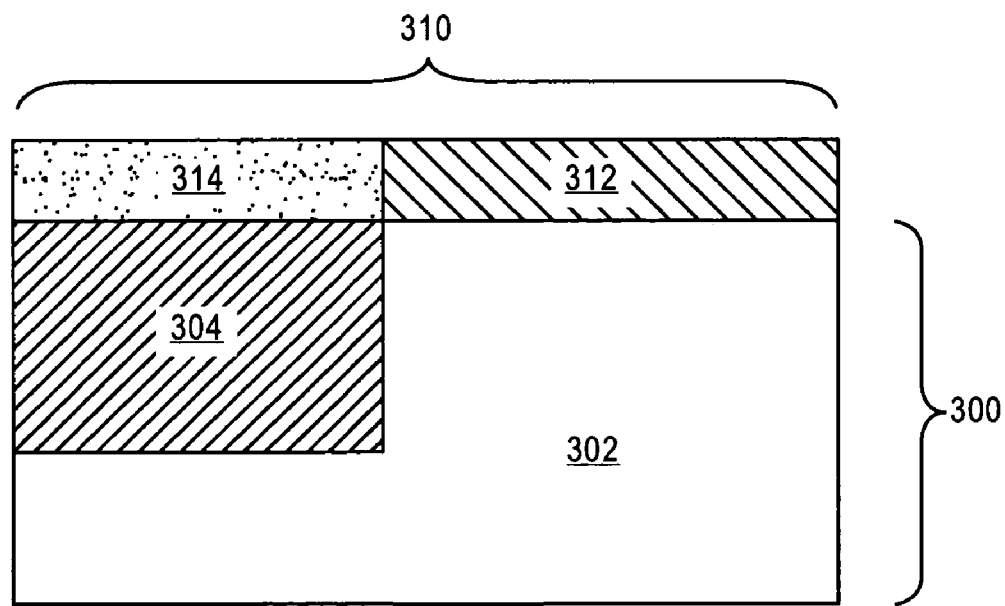

Referring to FIG. 3B, semiconductor film 310 may be deposited non-selectively on the crystalline portion 302 and on the amorphous portion 304 of substrate 300. In accordance with one embodiment of the present invention, a suitable non-selectively deposited semiconductor film 310 is one which forms an epitaxial region 312 above crystalline portion 302 and an amorphous region 314 above amorphous portion 304. Semiconductor film 310 may be deposited by any suitable technique. In one embodiment, semiconductor film 310 is deposited by chemical vapor deposition, physical vapor deposition or atomic layer deposition. In one embodiment, semiconductor film 310 is lattice-matched with crystalline portion 302. In another embodiment, semiconductor film 310 is lattice-mismatched with and has a smaller lattice constant than crystalline portion 302. In another embodiment, semiconductor film 310 is lattice-mismatched with and has a larger lattice constant than crystalline portion 302. In an embodiment, semiconductor film 310 is a carbon-doped silicon film. In another embodiment, semiconductor film 310 is a carbon-doped silicon film in situ doped with phosphorus dopant atoms. In the case of a carbon-doped silicon film, the carbon concentration as a % of total film composition may vary depending on the required application. In one embodiment, the total carbon concentration of a carbon-doped silicon semiconductor film is 0-0.1%. In another embodiment, the total carbon concentration of a carbon-doped silicon semiconductor film is 0.1-2%. In another embodiment, the total carbon concentration of a carbon-doped silicon semiconductor film is greater than 2%. In one embodiment, a carbon-doped silicon semiconductor film is deposited with a chemical vapor deposition technique using the precursors silane and methane.

Figure 3C:
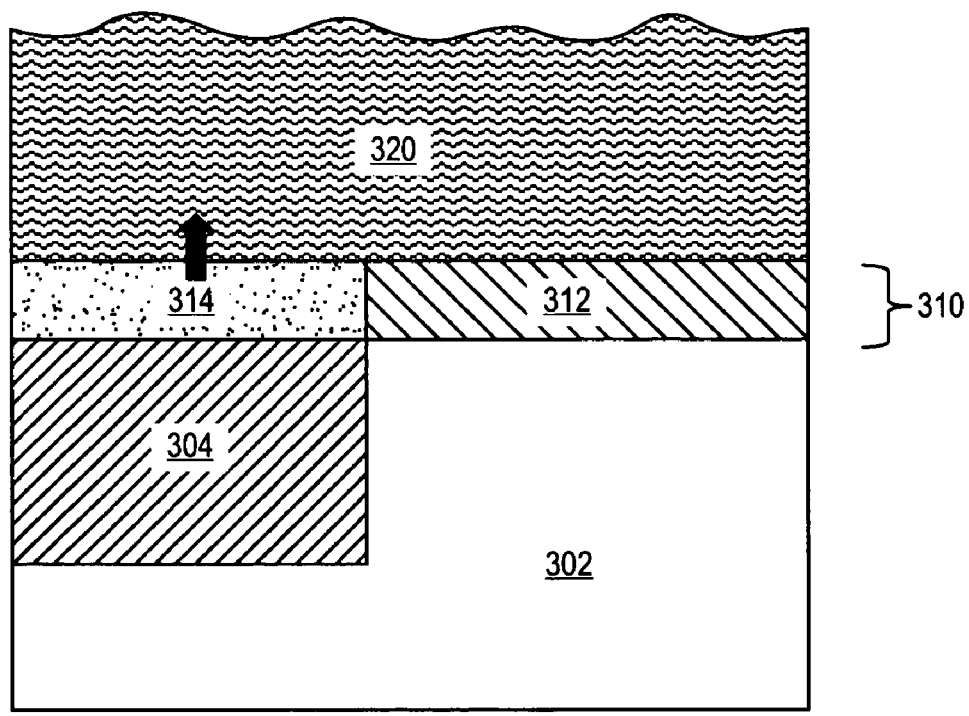

Referring to FIG. 3C, a wet etch mixture 320 may be applied to the surface of semiconductor film 310. A suitable wet etch mixture 320 may be one that selectively etches/dissolves amorphous region 314 of semiconductor film 310, as depicted by the arrow, while having a negligible effect on epitaxial region 312. Furthermore, a suitable wet etch mixture 320 may account for local pH differences that occur near the surface of semiconductor film 310 during the dissolving (etching) of amorphous region 314. In accordance with an embodiment of the present invention, wet etch mixture 320 is a four-component wet etch mixture comprising an oxidizing agent, an etchant, a buffer and a diluent. In one embodiment, semiconductor film 310 is comprised of a 0-0.1% carbon-doped silicon film and four-component wet etch mixture 320 is comprised of 180 parts per volume nitric acid (70% aqueous solution), 1 part per volume hydrofluoric acid (49% aqueous solution), 1100 parts per volume acetic acid (100%, glacial) and no additional parts per volume water. In another embodiment, semiconductor film 310 is comprised of a 0.1-2% carbon-doped silicon film and four-component wet etch mixture 320 is comprised of 100 parts per volume nitric acid (70% aqueous solution), 1 part per volume hydrofluoric acid (49% aqueous solution), 200 parts per volume acetic acid (100%, glacial) and 50 additional parts per volume water. In another embodiment, semiconductor film 310 is comprised of greater than 2% carbon-doped silicon film and four-component wet etch mixture 320 is comprised of 75 parts per volume nitric acid (70% aqueous solution), 1 part per volume hydrofluoric acid (49% aqueous solution), 100 parts per volume acetic acid (100%, glacial) and 25 additional parts per volume water. In one embodiment, wet etch mixture 320 is applied in the temperature range of 20-30° C. during removal of amorphous region 314. In another embodiment, wet etch mixture 320 is applied to the structure in FIG. 3B by an immersion technique or by a spray-on chemical injection technique. In one embodiment, amorphous region 314 is etched until completely removed by wet etch mixture 320.

Figure 3D:
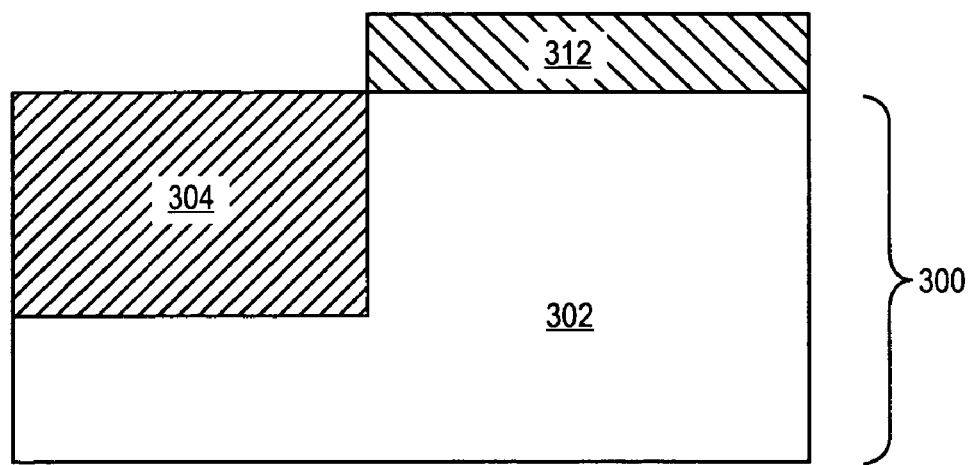

Referring to FIG. 3D, upon complete etching of amorphous region 314, wet etch mixture 320 may be removed. In accordance with an embodiment of the present invention, only epitaxial region 312 (which is above crystalline portion 302) of non-selectively deposited semiconductor film 310 remains above substrate 300 following treatment with wet etch mixture 320. In one embodiment, crystalline portion 302 of substrate 300 has a larger lattice constant than epitaxial region 312. In one embodiment, crystalline portion 302 of substrate 300 is comprised of silicon and epitaxial region 312 is comprised of carbon-doped silicon.

Figure 4A:
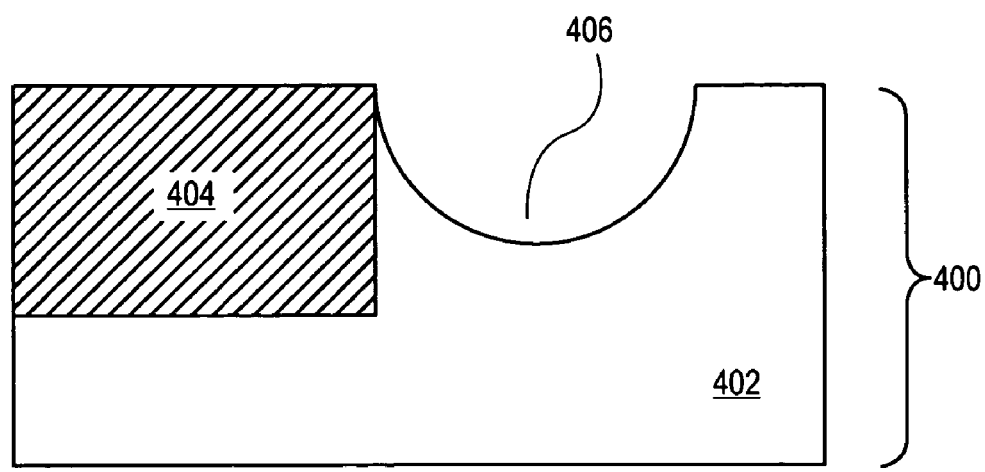
FIGS. 4A-D illustrate cross-sectional views representing the non-selective deposition and subsequent selective etching of a semiconductor film on a substrate comprising a crystalline portion and an amorphous portion, wherein a region in the crystalline portion is recessed to form an etched-out region in the crystalline portion, in accordance with an embodiment of the present invention.

As an example of another embodiment of the present invention, FIGS. 4A-D illustrate the non-selective deposition and subsequent selective etching of a semiconductor film on a substrate comprising a crystalline portion and an amorphous portion, wherein a region in the crystalline portion is recessed to form an etched-out region in the crystalline portion. Referring to FIG. 4A, a region of single crystalline portion 402 of substrate 400 may be recessed to form etched-out region 406. Etched out region 406 may be formed by first masking substrate 400 with a masking layer and then etching any exposed regions of crystalline portion 402 with a dry etch or wet etch treatment. In one embodiment, $SF_6$ or $NF_3$ gas in a plasma etcher is used to form etched-out region 406. In accordance with one embodiment of the present invention, crystalline portion 402 is comprised of crystalline silicon or an epitaxial silicon region grown atop a distinct crystalline silicon substrate. In another embodiment, crystalline portion 402 is comprised of germanium or a III-V material such as but not limited to gallium nitride, gallium phosphide, gallium arsenide, indium phosphide or indium antimonide. In one embodiment, amorphous portion 404 is comprised of an oxide or a nitride material. In another embodiment, amorphous portion 404 is comprised of silicon nitride, silicon dioxide, silicon oxynitride or a high-k material such as hafnium oxide.

Figure 4B:
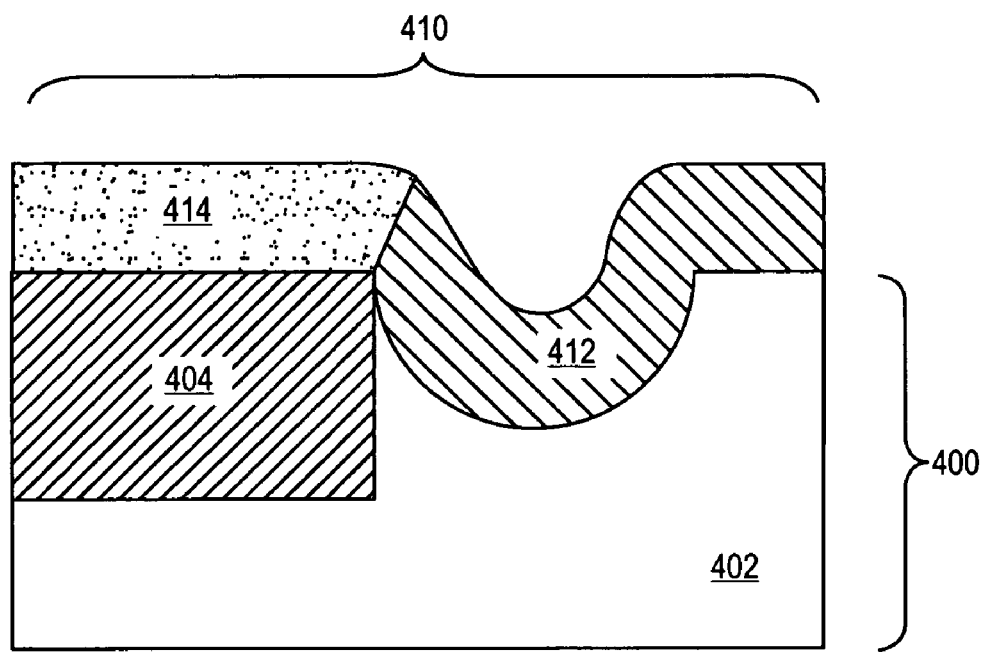

Referring to FIG. 4B, semiconductor film 410 may be deposited non-selectively above the crystalline portion 402, the amorphous portion 404 and the etched-out region 406 of substrate 400. In accordance with one embodiment of the present invention, a suitable non-selectively deposited semiconductor film 410 is one which forms an epitaxial region 412 above crystalline portion 402 and above etched-out region 406, while forming an amorphous region 414 above amorphous portion 404. Semiconductor film 410 may be deposited by any suitable technique. In one embodiment, semiconductor film 410 is deposited by chemical vapor deposition, physical vapor deposition or atomic layer deposition. In one embodiment, semiconductor film 410 is lattice-matched with crystalline portion 402. In another embodiment, semiconductor film 410 is lattice-mismatched with and has a smaller lattice constant than crystalline portion 402. In another embodiment, semiconductor film 410 is lattice-mismatched with and has a larger lattice constant than crystalline portion 402. In an embodiment, semiconductor film 410 is a carbon-doped silicon film. In another embodiment, semiconductor film 410 is a carbon-doped silicon film in situ doped with phosphorus dopant atoms. In the case of a carbon-doped silicon film, the carbon concentration as a % of total film composition may vary depending on the required application. In one embodiment, the total carbon concentration of a carbon-doped silicon semiconductor film is 0-0.1%. In another embodiment, the total carbon concentration of a carbon-doped silicon semiconductor film is 0.1-2%. In another embodiment, the total carbon concentration of a carbon-doped silicon semiconductor film is greater than 2%. In one embodiment, a carbon-doped silicon semiconductor film is deposited with a chemical vapor deposition technique using the precursors silane and methane. In one embodiment, the top surface of semiconductor film 410 above etched out region 406 is raised above the top surface of substrate 400.

Figure 4C:
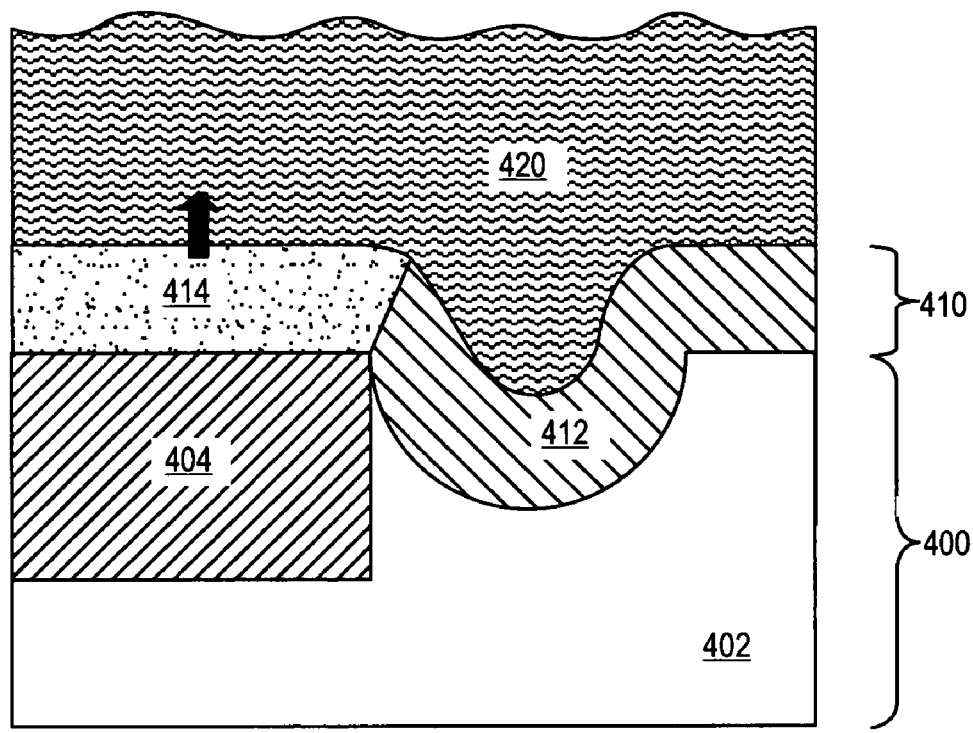

Referring to FIG. 4C, a wet etch mixture 420 may be applied to the surface of semiconductor film 410. A suitable wet etch mixture 420 may be one that selectively etches/dissolves amorphous region 414 of semiconductor film 410, as depicted by the arrow, while having a negligible effect on epitaxial region 412. Furthermore, a suitable wet etch mixture 420 may account for local pH differences that occur near the surface of semiconductor film 410 during the dissolving (etching) of amorphous region 414. In accordance with an embodiment of the present invention, wet etch mixture 420 is a four-component wet etch mixture comprising an oxidizing agent, an etchant, a buffer and a diluent. In one embodiment, semiconductor film 410 is comprised of a 0-0.1% carbon-doped silicon film and four-component wet etch mixture 420 is comprised of 180 parts per volume nitric acid (70% aqueous solution), 1 part per volume hydrofluoric acid (49% aqueous solution), 1100 parts per volume acetic acid (100%, glacial) and no additional parts per volume water. In another embodiment, semiconductor film 410 is comprised of a 0.1-2% carbon-doped silicon film and four-component wet etch mixture 420 is comprised of 100 parts per volume nitric acid (70% aqueous solution), 1 part per volume hydrofluoric acid (49% aqueous solution), 200 parts per volume acetic acid (100%, glacial) and 50 additional parts per volume water. In another embodiment, semiconductor film 410 is comprised of greater than 2% carbon-doped silicon film and four-component wet etch mixture 420 is comprised of 75 parts per volume nitric acid (70% aqueous solution), 1 part per volume hydrofluoric acid (49% aqueous solution), 100 parts per volume acetic acid (100%, glacial) and 25 additional parts per volume water. In one embodiment, wet etch mixture 420 is applied in the temperature range of 20-30° C. during removal of amorphous region 414. In another embodiment, wet etch mixture 420 is applied to the structure in FIG. 4B by an immersion technique or by a spray-on chemical injection technique. In one embodiment, amorphous region 414 is etched until completely removed by wet etch mixture 420.

Figure 4D:
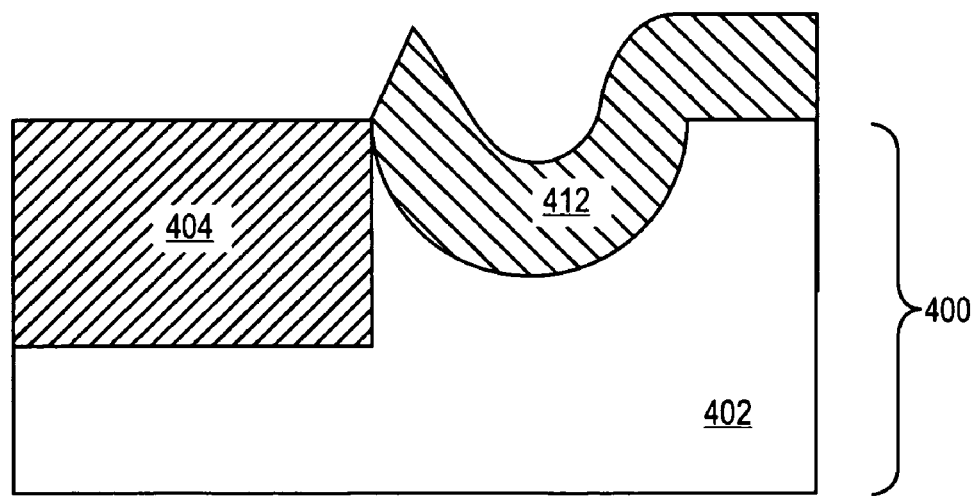

Referring to FIG. 4D, upon complete etching of amorphous region 414, wet etch mixture 420 may be removed. In accordance with an embodiment of the present invention, only epitaxial region 412 (which is above crystalline portion 402 and above etched-out region 406) of non-selectively deposited semiconductor film 410 remains in and above substrate 400 following treatment with wet etch mixture 420. In one embodiment, crystalline portion 402 of substrate 400 has a larger lattice constant than epitaxial region 412. In another embodiment, crystalline portion 402 of substrate 400 is comprised of silicon and epitaxial region 412 is comprised of carbon-doped silicon. In one embodiment, the top surface of epitaxial region 412 in etched-out region 406 is raised above the top surface of substrate 400.

The method to selectively etch with a four-component etch mixture, and hence pattern, a semiconductor film deposited non-selectively may be utilized in the fabrication of a semiconductor device. In one embodiment, the semiconductor device is a MOS-FET, a bipolar transistor, a memory transistor or a micro-electronic machine (MEM). In another embodiment, the semiconductor device is a planar device or a non-planar device, such as a tri-gate or double-gate transistor. For illustrative purposes, the fabrication of an NMOS-FET device incorporating a four-component selective etch process to pattern a semiconductor film deposited non-selectively is described below, in accordance with one embodiment of the present invention.

Figure 5A:
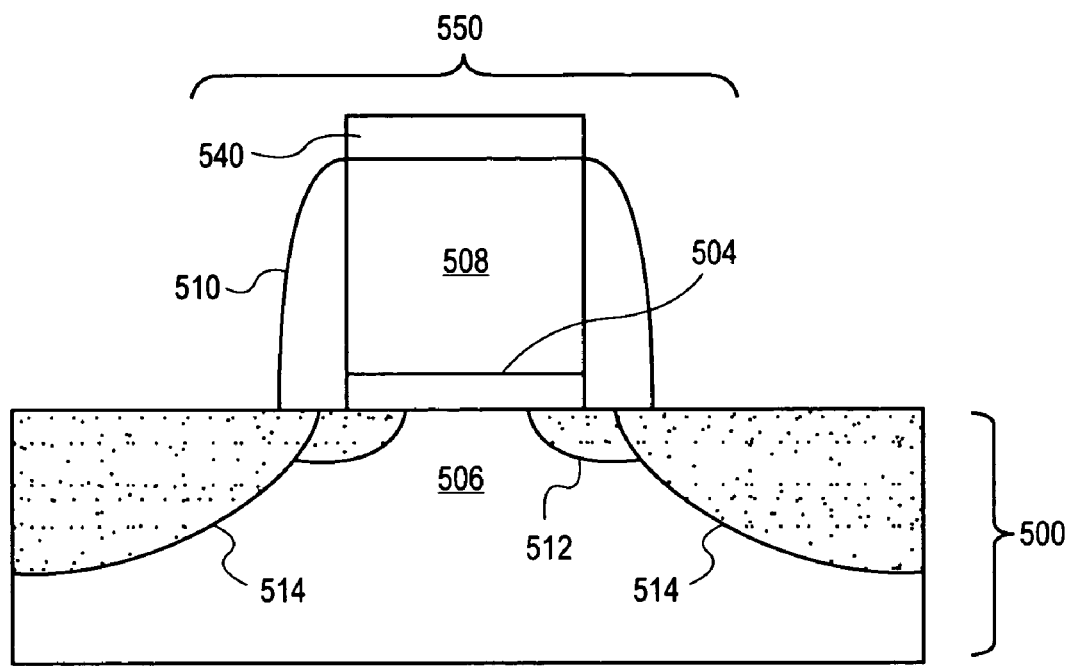
FIGS. 5A-E illustrate cross-sectional views representing a process flow for forming an NMOS-FET device with strain-inducing source/drain regions as facilitated by a four-component selective etch mixture, in accordance with an embodiment of the present invention.

FIGS. 5A-E illustrate a process flow for forming an NMOS-FET device with strain-inducing source/drain regions as facilitated by a four-component selective etch, mixture, in accordance with an embodiment of the present invention. Referring to FIG. 5A, a non-strained NMOS-FET 550 is first formed. Non-strained NMOS-FET 550 may be comprised of a channel region 506 in a crystalline substrate 500. In one embodiment of the present invention, crystalline substrate 500 is comprised of single crystalline silicon. In another embodiment, crystalline substrate 500 is comprised of an epitaxial silicon layer grown atop a distinct crystalline silicon substrate. In one embodiment, crystalline substrate 500 is comprised of germanium or a III-V material such as but not limited to gallium nitride, gallium phosphide, gallium arsenide, indium phosphide or indium antimonide.

A gate dielectric layer 504 may be formed above channel region 506. In one embodiment, gate dielectric layer 504 is formed by a thermal oxidation process and is comprised of silicon dioxide or silicon oxy-nitride. In another embodiment, gate dielectric layer 504 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 508 may be formed above gate dielectric layer 504. Gate electrode 508 may be formed by a subtractive etching process scheme or by a replacement gate process scheme. In one embodiment, gate electrode 508 is comprised of a polycrystalline silicon gate electrode, wherein the charge carrier dopant impurities are implanted during fabrication of the tip and source/drain regions, described below. In another embodiment, gate electrode 508 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, an amorphous gate protecting layer 540 comprised of silicon dioxide, silicon nitride, silicon oxy-nitride or carbon-doped silicon nitride is formed above gate electrode 508, as depicted in FIG. 5A.

A tip extension 512 may be formed by implanting charge carrier dopant impurity atoms into crystalline substrate 500. Gate electrode 508 may act to mask a portion of crystalline substrate 500 to form self-aligned tip extensions 512. In one embodiment, boron, arsenic, phosphorus, indium or a combination thereof is implanted into crystalline substrate 500 to form tip extension 512. In another embodiment, crystalline substrate 500 is implanted to form N-type tip extensions.

Gate dielectric layer 504 and gate electrode 508 may be isolated by amorphous gate isolation spacer 510. Amorphous gate isolation spacer 510 may be formed adjacent the sidewalls of gate dielectric layer 504 and gate electrode 508 by any suitable technique. In an embodiment, amorphous gate isolation spacer 510 is formed from an amorphous insulating layer such as but not limited to silicon dioxide, silicon nitride, silicon oxy-nitride or carbon-doped silicon nitride that is deposited by a chemical vapor deposition process and subsequently dry etched. In another embodiment, the thickness of the amorphous insulating layer is selected to determine the final width of amorphous gate isolation spacer 510. In one embodiment, amorphous gate isolation spacer 510 forms a hermetic seal with gate electrode 508 and the top surface of substrate 500 in order to encapsulate gate dielectric layer 504.

A source/drain region 514 may be formed by implanting charge carrier dopant impurity atoms into crystalline substrate 500. Thus, source/drain region 514 may be formed from the same material as channel region 506. Therefore, the lattice mismatch between source/drain region 514 and channel region 506 may be negligible, resulting in effectively no strain induced on channel region 506. Amorphous gate isolation spacer 510 and gate electrode 508 may act to shield a portion of crystalline substrate 500 during the implant step to form self-aligned source/drain regions 514. In effect, the thickness of amorphous gate isolation spacer 510 may play a role in dictating the dimensions of source/drain region 514. In one embodiment, boron, arsenic, phosphorus, indium or a combination thereof is implanted into crystalline substrate 500 to form source/drain regions 514. In one embodiment, the source/drain implant step is carried out to add charge carrier dopant impurities to a polycrystalline gate electrode.

Figure 5B:
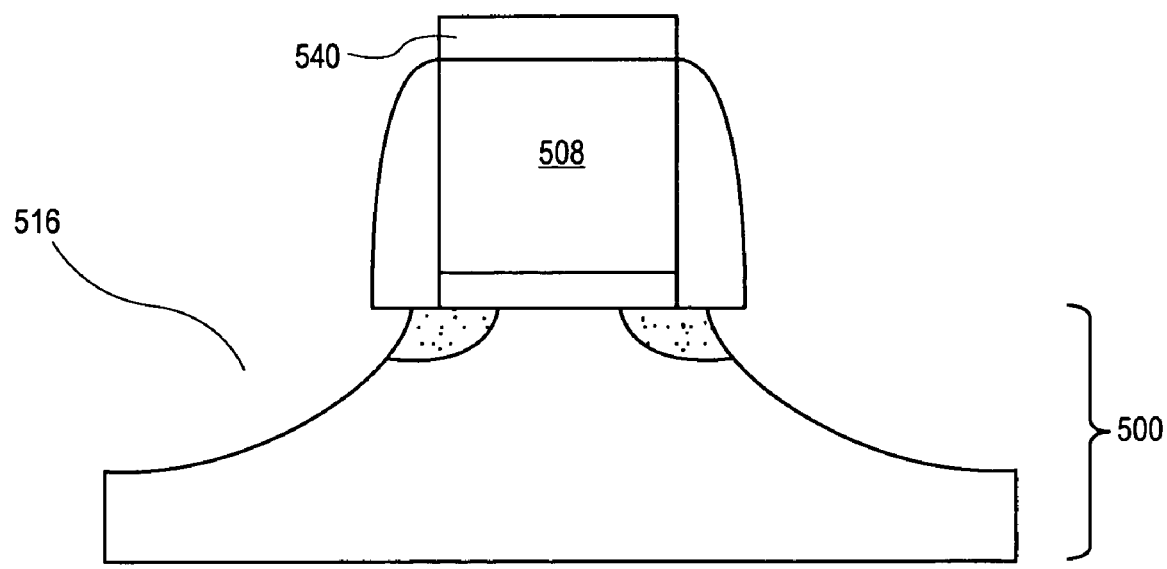

Referring to FIG. 5B, portions of crystalline substrate 500, including source/drain regions 514, may be removed to form etched-out region 516 in crystalline substrate 500. Etched-out region 516 may be formed by any suitable technique, such as a dry etch or a wet etch process. In one embodiment, $SF_6$ or $NF_3$ gas in a plasma etcher is used to form etched-out region 516. In another embodiment, protective layer 540 protects gate electrode 508 during the formation of etched-out region 516. In one embodiment, etched-out region 516 is formed to a depth sufficient to remove the charge carrier dopant impurities implanted to form source/drain region 514.

Figure 5C:
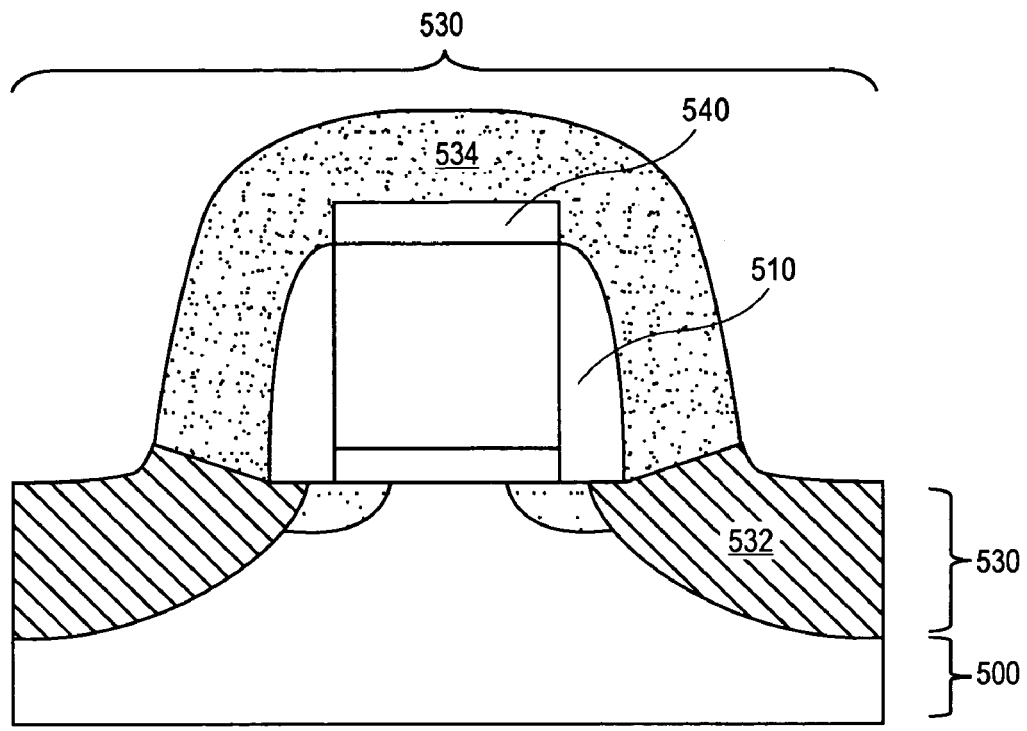

Referring to FIG. 5C, semiconductor film 530 may be deposited non-selectively on the surface of the structure formed in FIG. 5B, including above etched-out region 516 of crystalline substrate 500. In accordance with one embodiment of the present invention, a suitable non-selectively deposited semiconductor film 530 is one which forms an epitaxial region 532 above etched-out region 516 of crystalline substrate 500, while forming an amorphous region 534 above amorphous gate protection layer 540 and amorphous gate isolation spacers 510. Semiconductor film 530 may be deposited by any suitable technique. In one embodiment, semiconductor film 530 is deposited by chemical vapor deposition, physical vapor deposition or atomic layer deposition. In one embodiment, semiconductor film 530 is lattice-matched with crystalline substrate 500. In another embodiment, semiconductor film 530 is lattice-mismatched with and has a smaller lattice constant than crystalline substrate 500. In another embodiment, semiconductor film 530 is lattice-mismatched with and has a larger lattice constant than crystalline substrate 500. In an embodiment, semiconductor film 530 is a carbon-doped silicon film. In another embodiment, semiconductor film 530 is a carbon-doped silicon film in situ doped with phosphorus dopant atoms. In the case of a carbon-doped silicon film, the carbon concentration as a % of total film composition may vary depending on the required application. In one embodiment, the total carbon concentration of a carbon-doped silicon semiconductor film is 0-0.1%. In another embodiment, the total carbon concentration of a carbon-doped silicon semiconductor film is 0.1-2%. In another embodiment, the total carbon concentration of a carbon-doped silicon semiconductor film is greater than 2%. In one embodiment, a carbon-doped silicon semiconductor film is deposited with a chemical vapor deposition technique using the precursors silane and methane. In one embodiment, the top surface of semiconductor film 530 above etched-out region 516 is raised above the top surface of crystalline substrate 500.

Figure 5D:
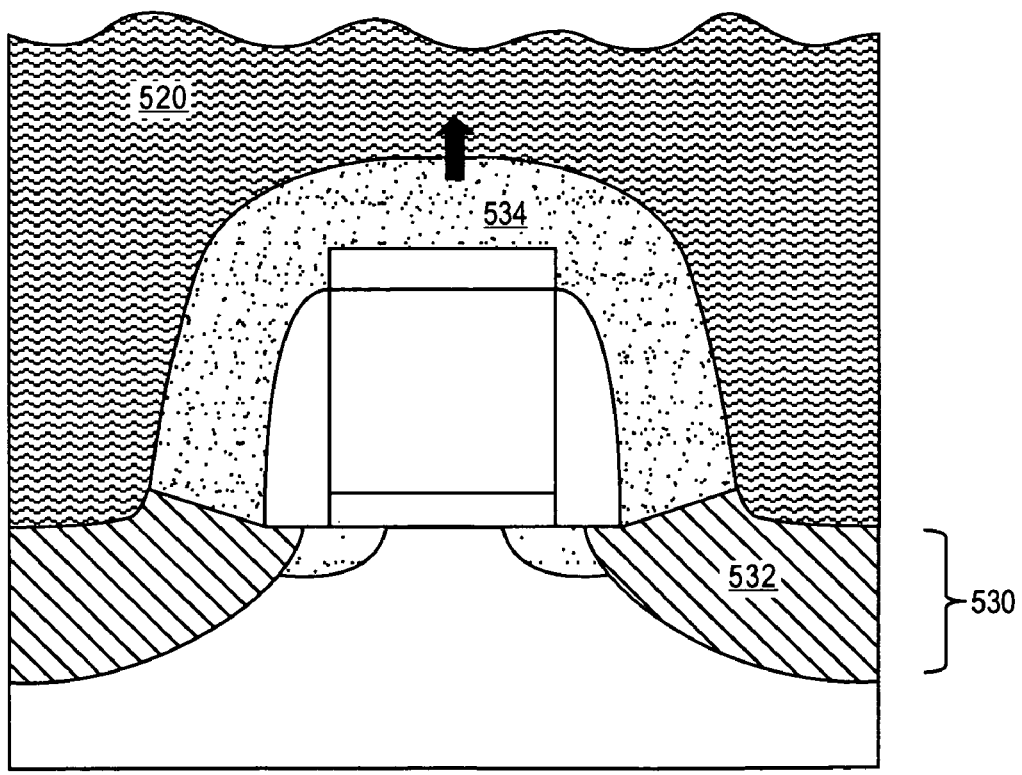

Referring to FIG. 5D, a wet etch mixture 520 may be applied to the surface of semiconductor film 530. A suitable wet etch mixture 520 may be one that selectively etches/dissolves amorphous region 534 of semiconductor film 530, as depicted by the arrow, while having a negligible effect on epitaxial region 532. Furthermore, a suitable wet etch mixture 520 may account for local pH differences that occur near the surface of semiconductor film 530 during the dissolving (etching) of amorphous region 534. In accordance with an embodiment of the present invention, wet etch mixture 520 is a four-component wet etch mixture comprising an oxidizing agent, an etchant, a buffer and a diluent. In one embodiment, semiconductor film 530 is comprised of a 0-0.1% carbon-doped silicon film and four-component wet etch mixture 520 is comprised of 180 parts per volume nitric acid (70% aqueous solution), 1 part per volume hydrofluoric acid (49% aqueous solution), 1100 parts per volume acetic acid (100%, glacial) and no additional parts per volume water. In another embodiment, semiconductor film 530 is comprised of a 0.1-2% carbon-doped silicon film and four-component wet etch mixture 520 is comprised of 100 parts per volume nitric acid (70% aqueous solution), 1 part per volume hydrofluoric acid (49% aqueous solution), 200 parts per volume acetic acid (100%, glacial) and 50 additional parts per volume water. In another embodiment, semiconductor film 530 is comprised of greater than 2% carbon-doped silicon film and four-component wet etch mixture 520 is comprised of 75 parts per volume nitric acid (70% aqueous solution), 1 part per volume hydrofluoric acid (49% aqueous solution), 100 parts per volume acetic acid (100%, glacial) and 25 additional parts per volume water. In one embodiment, wet etch mixture 520 is applied in the temperature range of 20-30° C. during removal of amorphous region 534. In another embodiment, wet etch mixture 520 is applied to the structure in FIG. 5C by an immersion technique or by a spray-on chemical injection technique. In one embodiment, amorphous region 534 is etched until completely removed by wet etch mixture 520.

Figure 5E:
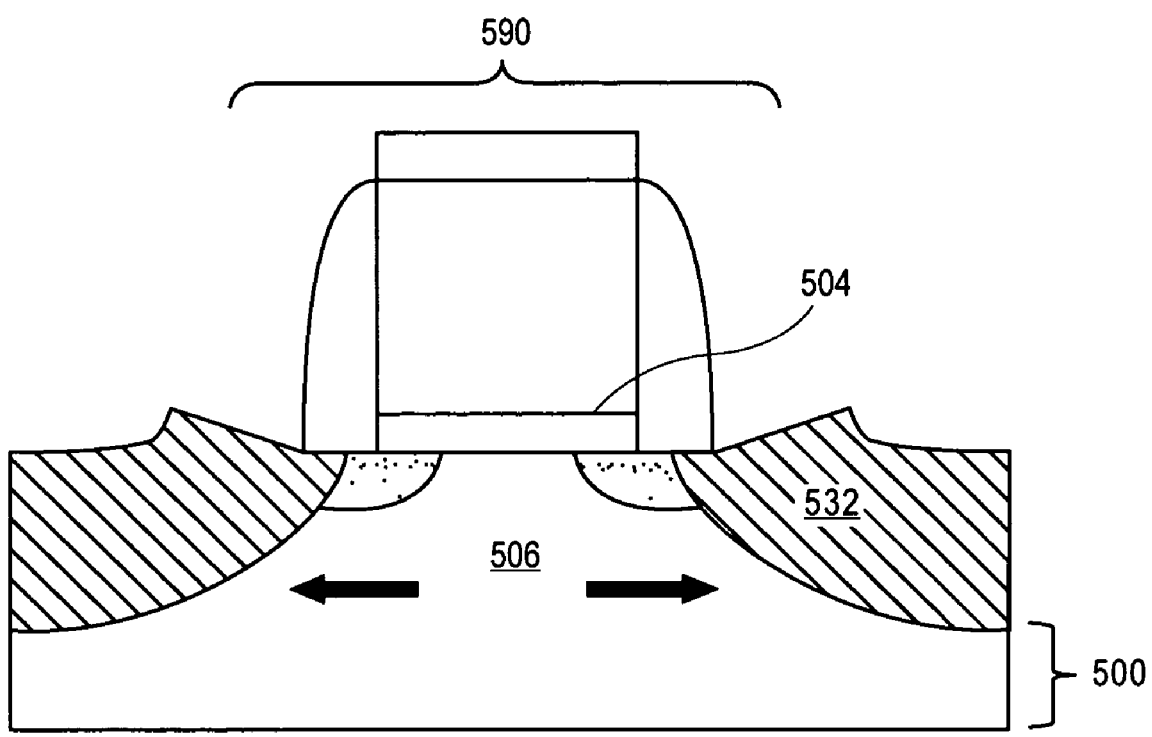

Referring to FIG. 5E, upon complete etching of amorphous region 534 of semiconductor film 530, wet etch mixture 520 may be removed. In accordance with an embodiment of the present invention, only epitaxial region 532 of non-selectively deposited semiconductor film 530 remains above crystalline substrate 500 following treatment with wet etch mixture 520. In one embodiment, crystalline substrate 500, and hence channel region 506, has a larger lattice constant than epitaxial region 532. In one embodiment, crystalline substrate 500 is comprised of silicon and epitaxial region 532 is comprised of carbon-doped silicon. In one embodiment, epitaxial region 532 is comprised of carbon-doped silicon and is subsequently implanted with phosphorus dopant impurities in a concentration range of $2E19$ atoms/cm$^3$–$2E21$ atoms/cm$^3$.

Epitaxial region 532 may function as a strain-inducing region and thus NMOS-FET 590 in FIG. 5E may comprise a strained source/drain region. Therefore, a uniaxial tensile strain, depicted by the arrows in FIG. 5E, may be rendered on channel region 506 in NMOS-FET 590, which can enhance electron mobility in the device. In one embodiment, the top surface of epitaxial region 532 is raised above the top surface of crystalline substrate 500, where gate dielectric layer 504 resides, as depicted in FIG. 5E. NMOS-FET 590 may subsequently be incorporated into an integrated circuit by conventional process steps, as known in the art.

The present invention is not limited to the formation of NMOS-FET devices with strain-inducing source/drain regions. In accordance with another embodiment of the present invention, a PMOS-FET comprising strain-inducing source/drain regions may be fabricated in a manner similar to that depicted in FIGS. 5A-E. In an embodiment, a non-selectively deposited silicon/germanium film has an amorphous region and an epitaxial region. A four-component wet etch mixture may be tuned to accommodate the selective etching of the amorphous region of the silicon/germanium film while having negligible impact on the epitaxial region, wherein the four-component wet etch mixture comprises an oxidizing agent, an etchant, a buffer and a diluent.

Thus, a method to selectively etch, and hence pattern, a semiconductor film deposited non-selectively has been disclosed. In one embodiment, a carbon-doped silicon film is deposited non-selectively such that the film forms an epitaxial region where deposited on a crystalline surface and an amorphous region where deposited on an amorphous surface. A four-component wet etch mixture may be tuned to accommodate the selective etching of a variety of film compositions, wherein the four-component wet etch mixture comprises an oxidizing agent, an etchant, a buffer and a diluent. In one embodiment, the four-component wet etch mixture comprises nitric acid (oxidizing agent), hydrofluoric acid (etchant), acetic acid (buffer), and water (diluent).

What is claimed is:

1. A method of forming a semiconductor structure comprising:

forming a substrate comprising a crystalline portion and an amorphous portion;

depositing a semiconductor film non-selectively above said substrate, wherein said semiconductor film comprises an epitaxial region above said crystalline portion and an amorphous region above said amorphous portion; and etching said semiconductor film with a selective four-component wet etch mixture, wherein said amorphous region is removed from said amorphous portion of said substrate and said epitaxial region is retained above said crystalline portion of said substrate.

2. The method of claim 1 wherein said selective four-component wet etch mixture comprises an oxidizing agent, an etchant, a buffer and a diluent.

3. The method of claim 2 wherein said oxidizing agent comprises nitric acid, hydrogen peroxide or di-tert-butylperoxide.

4. The method of claim 1 wherein said selective four-component wet etch mixture etches said amorphous region of said semiconductor film at least 20-fold faster than said epitaxial region.

5. The method of claim 1 wherein said crystalline portion of said substrate is comprised of silicon and said semiconductor film is comprised of carbon-doped silicon.

6. The method of claim 5 wherein said semiconductor film is comprised of 0.1-2% carbon-doped silicon and said selective four-component wet etch mixture is comprised of 100 parts per volume nitric acid (70% aqueous solution), 1 part per volume hydrofluoric acid (49% aqueous solution), 200 parts per volume acetic acid (100%, glacial) and 50 additional parts per volume water.

7. A method of forming a semiconductor structure comprising:
    forming a substrate comprising a crystalline portion and an amorphous portion;
    forming an etched-out region in said crystalline portion of said substrate;
    depositing a semiconductor film non-selectively above said substrate, wherein said semiconductor film comprises an epitaxial region above said crystalline portion and above said etched-out region and an amorphous region above said amorphous portion, and wherein said epitaxial region and said crystalline portion are lattice mismatched; and
    etching said semiconductor film with a selective four-component wet etch mixture, wherein said amorphous region is removed from said amorphous portion of said substrate and said epitaxial region is retained above said crystalline portion and said etched-out region of said substrate.

8. The method of claim 7 wherein said selective four-component wet etch mixture comprises an oxidizing agent, an etchant, a buffer and a diluent.

9. The method of claim 8 wherein said oxidizing agent comprises nitric acid, hydrogen peroxide or di-tert-butylperoxide.

10. The method of claim 7 wherein said selective four-component wet etch mixture etches said amorphous region of said semiconductor film at least 20-fold faster than said epitaxial region.

11. The method of claim 7 wherein said crystalline portion of said substrate is comprised of silicon and said semiconductor film is comprised of carbon-doped silicon.

12. The method of claim 11 wherein said semiconductor film is comprised of 0.1-2% carbon-doped silicon and said selective four-component wet etch mixture is comprised of 100 parts per volume nitric acid (70% aqueous solution), 1 part per volume hydrofluoric acid (49% aqueous solution), 200 parts per volume acetic acid (100%, glacial) and 50 additional parts per volume water.

13. A method of forming a semiconductor device comprising:
    forming a gate dielectric layer above a channel region in a crystalline substrate;
    forming a gate electrode above said gate dielectric layer;
    forming an amorphous gate protecting layer above said gate electrode;
    forming an amorphous gate isolation spacer adjacent the sidewalls of said gate electrode and said gate dielectric layer;
    forming a source/drain region in said crystalline substrate;
    removing a portion of said crystalline substrate, including said source/drain region, to form an etched-out region in said crystalline substrate;
    depositing a semiconductor film non-selectively above said etched-out region, above said amorphous gate protecting layer and above said amorphous gate isolation spacer, wherein said semiconductor film comprises an epitaxial region above said etched-out region, an amorphous region above said amorphous gate protecting layer and an amorphous region above said amorphous gate isolation spacer; and
    etching said semiconductor film with a selective four-component wet etch mixture, wherein said amorphous region is removed from said amorphous gate protecting layer and from said amorphous gate isolation spacer, while said epitaxial region is retained above said etched-out region of said crystalline substrate.

14. The method of claim 13 wherein said epitaxial region of said semiconductor film and said crystalline substrate are lattice mismatched.

15. The method of claim 14 wherein said crystalline substrate is comprised of silicon and said semiconductor film is comprised of carbon-doped silicon.

16. The method of claim 15 wherein said semiconductor film is comprised of 0.1-2% carbon-doped silicon and said selective four-component wet etch mixture is comprised of 100 parts per volume nitric acid (70% aqueous solution), 1 part per volume hydrofluoric acid (49% aqueous solution), 200 parts per volume acetic acid (100%, glacial) and 50 additional parts per volume water.

17. The method of claim 13 wherein said selective four-component wet etch mixture comprises an oxidizing agent, an etchant, a buffer and a diluent.

18. The method of claim 17 wherein said oxidizing agent comprises nitric acid, hydrogen peroxide or di-tert-butylperoxide.

19. The method of claim 13 wherein said selective four-component wet etch mixture etches said amorphous region above said amorphous gate protecting layer and said amorphous region above said amorphous gate isolation spacer at least 20-fold faster than said epitaxial region above said etched-out region.

20. The method of claim 19 wherein said epitaxial region and said crystalline substrate are lattice mismatched.

* * * * *